United States Patent [19]

Nishizawa

[11] Patent Number: 4,540,466

[45] Date of Patent: Sep. 10, 1985

[54] METHOD OF FABRICATING SEMICONDUCTOR DEVICE BY DRY PROCESS UTILIZING PHOTOCHEMICAL REACTION, AND APPARATUS THEREFOR

[75] Inventor: Jun-ichi Nishizawa, Sendai, Japan

[73] Assignee: Semiconductor Research Foundation, Sendai, Japan

[21] Appl. No.: 604,118

[22] Filed: Apr. 26, 1984

[30] Foreign Application Priority Data

May 11, 1983 [JP] Japan ................................. 58-82368

[51] Int. Cl.³ ...................... H01L 21/306; B44C 1/22; C23F 1/02; B05D 3/06

[52] U.S. Cl. .................................... 156/643; 156/345; 156/646; 156/659.1; 204/192 EC; 204/192 E; 204/298; 118/728; 118/50.1; 118/620; 427/38

[58] Field of Search ............... 156/345, 643, 646, 635, 156/659.1; 204/164, 192 EC, 192 E, 298; 427/38, 39; 118/728, 50.1, 620

[56] References Cited

U.S. PATENT DOCUMENTS

| | | | |
|---|---|---|---|
| 2,841,477 | 7/1958 | Hall | 156/646 |
| 3,122,463 | 2/1964 | Ligenza et al. | |
| 4,158,589 | 6/1979 | Keller et al. | 156/345 |
| 4,183,780 | 1/1980 | McKenna et al. | 156/646 X |
| 4,259,145 | 3/1981 | Harper et al. | 156/345 |

OTHER PUBLICATIONS

H. Akiya, "Directional Dry Etching of Silicon by a Reactine Nozzle-Jet", Proceeding of Symposium on Dry Process, pp. 119–126, (Oct. 1981), Tokyo.

Primary Examiner—William A. Powell
Attorney, Agent, or Firm—Cushman, Darby & Cushman

[57] ABSTRACT

Photochemical technique is applied, in a unique manner, to the so-called dry process intended for etching a substrate or for deposition thereon in the presence of a gas supplied into a chamber containing the substrate. The interior of this chamber is so structured as to produce a higher pressure gas region and a lower pressure gas region. A beam of light rays is caused to impinge onto the former region to activate the particles of gas. The resulting gas containing the activated particles is fed onto the substrate placed in the latter region as carried through at least one passageway provided between the two regions by the flow of gas caused due to the difference in pressure of gas in these two regions. Thus, the aimed etching or deposition is carried out without damaging the surface of the substrate which would occur by the collision of the otherwise heavily energized particles against the surface of the substrate.

21 Claims, 3 Drawing Figures

METHOD OF FABRICATING SEMICONDUCTOR DEVICE BY DRY PROCESS UTILIZING PHOTOCHEMICAL REACTION, AND APPARATUS THEREFOR

BACKGROUND OF THE INVENTION (a) Field of the Invention

The present invention concerns a method of fabricating semiconductor devices by relying on the so-called dry process which is one of the semiconductor device fabricating methods, and more particularly it concerns the method of applying photochemical reaction to the dry process, and also an apparatus therefor.

(b) Description of the Prior Art

For the fabrication of various kinds of electronic devices such as semiconductor devices represented by, for example, transistors and integrated circuits (IC's), there are being adopted fabricating techniques of progressively ascending levels to meet the ever-advancing requirements for realizing higher levels of performance and greater miniaturization of the devices. In these devices, the size of the IC-constituent devices, the intervals between these devices and the diameters of the lead wires formed on integrated circuits have become calibrated to measure by the order of micrometer. Thus, the dimension of the device in the lateral direction is presently limited for a tolerance or error of only about ±0.1 micrometer. With respect to the vertical direction, there prevails the requirement for the formation of very thin films having the thickness of about several hundred Å. Depending on the cases, there is the need to provide a multi-layer structure in which these thin films are stacked one upon another into several laminated layers.

For the reasons mentioned above, there has been the constant requirement to develop a very high degree of, i.e. high precision, technique or method in the process of depositing or etching various kinds of such thin films having different functions relative to each other.

The techniques of deposition and of etching which have recently become practiced or have become important of late satisfying the above-mentioned requirements are called the "dry process" in a broad sense of the words in the field of semiconductors.

The mention of the terms "in a broad sense of the words" hereinabove is based on the following considerations.

The technique which is called "photolithography" employed in the field of art of semiconductors points to the art of selectively etching such a film as $SiO_2$ or $Si_3N_4$ formed on the surface of the semiconductor by the use of a photoresist and a chemical etchant containing, for example, fluoric acid (HF). This is an important technique which is being used currently in the process of fabricating semiconductor devices. It has been very difficult, however, to limit the error or tolerance of the dimension accuracy after etching to the above-mentioned level of about ±0.1 μm. Accordingly, as a high-precision etching process which can substitute the abovesaid technique, there has been put to practice the so-called sputtering process (including DC sputtering, RF sputtering, microwave sputtering, reactive sputtering, and gas plasma sputtering) which typically is arranged so that a substrate to be etched is placed in a vacuum chamber, and under a gaseous atmosphere produced by introducing an inert gas such as Argon and a reacting gas such as carbon tetrachloride ($CCl_4$), either a DC voltage or a radio frequency voltage is applied across the electrodes to cause a glow discharge to thereby etch a required site or sites of the substrate. Other than those mentioned above, there has been started to be used also an ion etching technique using an ion beam. The etching mechanism of this latter technique may be regarded to be basically identical with that of sputtering.

In the field of semiconductors, the former-mentioned etching process using a chemical etchant is called the "wet process", in contrast to the latter etching process using abovesaid sputtering techniques, ion beam technique or discharge process in the field of "discharge chemistry" which is customarily called the "dry etching process" or simply the "dry process".

This "discharge chemistry" will be briefed hereunder by taking up an example of the abovesaid sputtering techniques. Into a vacuum chamber containing two opposing electrodes is charged, for example, argon gas (Ar), and a DC voltage is applied across these electrodes to produce a glow discharge. Whereupon, Ar gas is ionized to become $Ar^+$ which collides against the substrate to drive out the atoms or molecules of the substrate. This process represents the "etching". Instead of using Ar gas, there may be charged such a gas as will cause chemical reaction with the atoms of the substrate. By so doing, there can be performed various processes such as deposition and etching.

However, the technical term "dry process" would be more suitable when it is considered in a broader concept than limiting it only to the use for specific types of etching mentioned above. The term "dry process" used in the present invention indeed represents the abovesaid broader sense. This is because of the consideration that the sputtering method (which, in practice, is called either the reactive sputtering or plasma CVD technique) is used as the art of forming, by deposition, a thin film of such a substance as amorphous Si, polycrystalline Si, $SiO_2$, $Si_3O_4$ or TaN with good precision (i.e. elaborately controlling the thickness as well as the film quality or condition). It should be noted here that the methods of forming a thin film by the sputtering technique or by the vacuum deposition technique are called, in general, the Physical Vapor Deposition (PVD) in contrast to the Chemical Vapor Deposition (CVD). It should be noted also that, for example, the vapor epitaxial growth which is one type of the CVD technique is such that a thermal energy is applied to a reacting gas to cause deposition by virtue of hydrogen reduction or pyrolysis. In contrast thereto, such method as the abovesaid plasma CVD technique is of the mechanism that the discharge energy (electric energy) such as by glow discharge is applied to the reacting gas, and the deposition is conducted under the conditions common to the ordinary sputtering technique and the CVD technique. The deposition mechanism also is not limited to one kind, but combinations of various mechanisms would be necessary for the formation or deposition of a thin film having a high level of functional characteristics.

Viewing this way, it will be noted that not only the ordinary CVD technique but also the deposition process which relies on the decompressed CVD technique intended to improve the uniformity of the thickness of the produced film by elongating the mean free path of the reacting gas may be likewise included in the dry process.

From the above-stated sense, the concept of "dry process" is considered to be applicable to the whole phenomena which would arise between the objective (article to be processed) and the gas-phase material, regardless of whether the process is intended for deposition or etching. Currently, however, the dry process which is capable of forming a thin film whose thickness is controlled efficiently with good precision, or which is capable of performing an etching which realizes the demensional precision with an error of the micrometric order is typically represented, as the main stream of the art, by the specific dry process arranged that a gas is introduced into a chamber in which a glow discharge is developed to render the gas-phase material to the activated state by the discharge energy (electric energy) thus produced, to accelerate the progress of the growth (deposition) of a film. In either the etching or the deposition process, the substrate (hereinafter will be referred to as the objective) on which these processes are conducted is placed in a sealed chamber, and the interior thereof is evacuated, followed by the introduction of a required gas thereinto, and electric power is applied across the electrodes housed in the chamber to develop a glow discharge. Even if the electrodes are set outside the chamber which is made of an insulating material, there will inevitably exist high energy particles in the discharge space.

In such an instance, the objective is placed either on the electrode, or in the vicinity of the electrode, or at a site relatively away from the electrode. In other words, the objective is placed in the region wherein there is developed an intensive glow discharge (i.e. the discharge region), or in a region adjacent to the discharge region but no distinct glow discharge phenomenon is produced (i.e. the non-discharge region). In this latter instance also, the circumstance within the chamber is such that there is hardly any difference in the gas pressure in the discharge region as compared to the region in which the objective is placed. Regardless of in whichever region the objective is to be placed, the material produced in the discharge region (which material, in general, consists of either gas-phase particles which provide the deposition layer or gas-phase particles which serve as the material for etching the objective) is supplied onto the objective.

When a glow discharge is developed by the introduction of a gas, those atoms and molecules which are contained in the charged gas are subjected to a discharge energy to be rendered to the state of having a higher energy, i.e. the activated state. As a result, there are developed in the gas phase not only an increase in the mere kinetic energy of atoms and molecules, but also such complicated reactions as chemical reaction including ionization, decomposition and synthesis, and also polymerization. For this reason, the electricity-charged particles such as electrons and ions are produced in considerably large amounts in the discharge region, and they will acquire a large kinetic energy by being subjected to an electric energy imparted by the glow discharge, i.e. they will acquire an increased velocity. These particles which have acquired an increased velocity will collide against neutral particles such as Ar to ionize them or impart a kinetic energy to them. This means that not only those particles (molecules, atoms, ions, electrons, etc.) which are necessary for the deposition onto or the etching of the objective, but also those particles which are not necessary for these purposes will also be supplied to the objective in either the ionized state from the electrical point of view or the neutral state and with a considerably high kinetic energy. The directions in which they are supplied to the objective are random in general. In certain cases, however, for example, in order to enhance the deposition rate, a magnet is placed in the vessel or the chamber, to uniformalize the orientation of supply of these particles with the aid of the magnetic field produced by the magnet, i.e. giving orientation of movement to the particles, in a certain type of dry process.

Any way, when gas-phase particles having a high kinetic energy as stated above are supplied to the objective, it often happens that the surface of the objective is damaged due to the collision thereagainst of these particles. This damage includes the development of such defects as lattice dislocations, clusterings, strains, etc. in the surface of the objective, aggravating the electric characteristics of the device or devices contained in the objective.

As discussed above, the deposition process and the etching process which are collectively called the dry process utilizing glow discharge is difficult to avoid the drawback, in the conventional art, of damaging the surface of the objective in spite of the fact that this dry process represents a high level of technique which is intended to efficiently control the dimension such as thickness and width of the objective with good accuracy.

Moreover, the value of the energy which is supplied to the gas by glow discharge is averagedly large. However, since the values of energy can range widely, the atoms and molecules contained in the gas would be activated in miscellaneous ways, causing various kinds of physical or chemical reactions to take place. Thus, it will be noted that no particular selected activation necessary for only the desired deposition or etching purpose is carried out in the conventional art.

In case, for example, it is intended to effect the deposition of amorphous silicon (a-Si) by relying on the plasma CVD technique using a gas containing $SiH_4$, the resulting a-Si film thus formed will be found to contain not only a-Si alone, but also various types of $Si_xH_y$ substances such as Si polycrystals or $SiH_4$. As will be appreciated from this phenomenon also, the process concurrently has such drawback as represented by the reactions which are not in line with the intended purpose, or by other undesirable reactions. Also, there may occur an instance wherein, although the dry process therein is intended only to the etching of an objective, the performance is such that not only the etching itself is done, but also, apart from that, irrelevant deposition would also take place at the same time.

Thus, there may be considered a method which insures that, among various kinds of atoms and molecules which have been imparted various types of conditions as a result of the activation in the discharge region, only those specfic particles which meet the intended purpose are selectively supplied onto the objective. Such a method, however, would inevitably lead to a very costly large-scale apparatus, and in addition, would give rise to the difficulty to select specific kind of particles with a good efficiency.

As the method of improving these drawbacks and problems of the prior art mentioned above, there have been proposed methods to promote the dry process by externally impinging light rays into the chamber or vessel in which the dry process is to be carried out.

One of such prior methods is designed to place an objective in the chamber in a region located adjacent to the discharge region, and to cause the beam of light rays to impinge onto the discharge region to thereby activate the gas which is charged in the chamber. This proposed prior art requires that the gas pressure is set low to develop a glow discharge, but this leads to a poor efficiency of activation of particles. Moreover, as discussed above, in this method also, particles having a large kinetic energy will collide against the objective, and damage the latter.

Another priorly proposed method is to place an objective in the discharge region of the chamber in which the charged gas is activated, and a beam of light rays are caused to impinge thereonto. It should be noted here that this prior art technique involves the problems that the gas is activated not only by the light rays incident thereonto, but also by the glow discharge as well, so that there will occur not only the aimed reaction but also those reactions which are not in line with the aimed purpose. Moreover, the surface of the objective would become contaminated by those products of such reactions that depart away from the aimed purpose.

Photochemical reaction process per se occurs selectively in many cases. This means that it is possible to develop a reaction selectively. Therefore, such a selective process acts powerfully to realize a clean process.

SUMMARY OF THE INVENTION

It is, therefore, the object of the present invention to provide a dry process useful for the fabrication of semiconductor devices with good precision, which is devoid of the above-mentioned drawbacks of the prior art.

More specifically, the object of the present invention is to provide a dry process as referred to above, which efficiently activates gas-phase particles such as atoms and/or molecules contained in the charged gas by a beam of light rays, and which keeps the objective which is being processed from being damaged by the collision of those particles having a high kinetic energy against the surface of the objective at the time of etching the objective or of deposition onto this surface thereof, and which, additionally, has the feature that the reaction process is characterized by directionality, and which, further, insures the process to be carried out cleanly without allowing the reaction products to stay in the vicinity of the objective, by a quick evacuation of these products therefrom.

DETAILED DESCRIPTION OF THE PREFERRED EMBODIMENTS

The present invention will hereunder be described in further detail by referring to the illustrated embodiments of apparatus.

Figure 1:
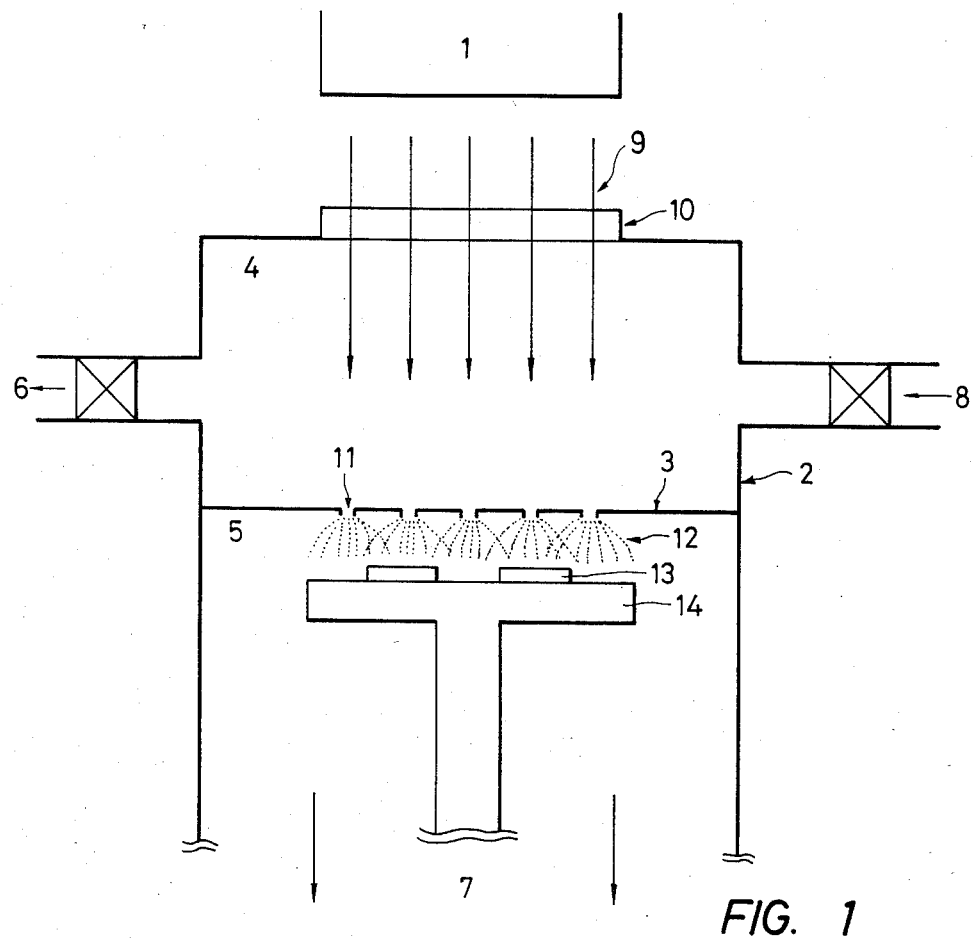
FIG. 1 is a diagrammatic representation of an embodiment of the apparatus for performing etching or deposition by relying on the dry process according to the present invention, by irradiating a beam of light rays onto the higher pressure gas region of the chamber based on the photochemistry principle, while supplying onto the objective placed in the lower pressure gas region the resulting photochemically activated gas-phase particles through ejection nozzles or through-holes having a small diameter provided between these two regions.

FIG. 1 shows a diagrammatic illustration of an apparatus structure employed in the present invention to explain the dry process of the present invention utilizing the photochemical technique.

Reference numeral 1 represents a light supply for exciting, by the light ray beam emitting therefrom, the particles of atoms and/or molecules contained in the charged gas used for the purpose of either etching or deposition. Numeral 2 represents a chamber in which the dry process of the present invention is carried out. The interior of this chamber 2 is divided, by a partition wall 3, into a higher pressure gas region 4 and a lower pressure gas region 5. These two regions 4 and 5 are connected to independent evacuation systems 6 and 7, respectively. The higher pressure gas region 4 is connected to a gas introducing system 8. An arrow 9 indicates the beam of light rays irradiating from the light supply 1. Numeral 10 represents a window which transmits those light rays having a required wavelength contained in the beam of light rays 9. The beam 9 of light rays transmits through the window 10 to be incident onto the higher pressure gas region 4 to activate the particles contained in this gas. Numeral 11 represents ejection ports or through-holes formed through the partition wall 3 for the ejection of the gas therethrough from the higher pressure gas region 4 into the lower pressure gas region 5. Those activated gas-phase particles which have been produced in the higher pressure gas region 4 when subjected to chemical or physical reactions due to their excitation by the incident light rays are allowed to eject through the through-holes 11 into the lower pressure gas region 5 in jet streams 12. An objective 13 for being processed is placed in the lower pressure gas region 5 for being etched or for deposition thereon. This objective 13 is supported on a table 14.

As will be appreciated by taking a look at the diagram of the apparatus shown in FIG. 1 designed for carrying out the dry process, the present invention is pointed to a dry process utilizing photochemistry, i.e. promotion of chemical and/or physical reactions and activation of gas-phase reactant by its exposure to the incident light rays having wavelengths in infrared (including far-infrared), visible and ultraviolet (including vacuum and deep ultraviolet) regions of spectrum. In many cases, infrared light is effective to excite molecules easy to cause a chemical reaction.

In case particles such as atoms and molecules contained in the charged gas are excited by the exposure of this gas to a beam of such light rays as mentioned above, the energy of photons are transmitted to the particles of the gas due to the interaction between the photons and the particles contained in the gas. It should be noted that, in such an instance, the kinetic energy of photons is negligibly small. Also, when these particles are promoted to the excited or activated state due to their absorption of the energy of photons, this leads to an increase in the internal energy such as an increase in the oscillation energy or rotation energy or an increase in the electronic energy of the particles, i.e. an elevation of the energy level of those electrons existing in the particles. Absorption of photons having a large energy or absorption of a large number of photons leads to ionization or decomposition of aimed particles. Accordingly there hardly occurs an increase in the kinetic energy of the particles themselves. Thus, the kinetic energy of the particles of the gas after excitation will not deviate substantially from the kinetic energy which follows Maxwell-Boltzmann distribution which, in turn, is determined by the temperature which the gas had possessed before the excitation.

More specifically, when the supply of energy performed by irradiation of light rays is compared with that by conventional glow discharge, the kinetic energy of the gas-phase particles given by the former is not so great as that imparted by the latter. Besides, the pressure of the gas located in the region which is subjected to the irradiation of light rays is set higher than that of the region wherein the objective is placed, so that a high efficiency of activation can be obtained. Also, the difference in gas pressure between the divided two regions produces a flow of gas directed toward the objective. In such an instance, those particles carried in the stream of gas will accomplish a collective uniform movement along the direction of flow of gas. In case gaseous particles eject through small-calibred through-holes from the higher pressure gas region having a higher gas viscosity into the lower pressure gas molecular- or atom-stream region, the streams of particles will form jet streams having uniform directions of advancement. In such a case also, the particles are unable to have the kinetic energy distribution deviating greatly from Maxwell-Boltzmann distribution. Averagely, their kinetic energy is about several 10meV at most. When, gaseous particles having a kinetic energy of this degree collide against the objective, there hardly will occur a damage to the surface of the objective. Moreover, because the objective is placed in a region of a relatively low pressure of gas, the particles do have a long mean free path in said region, and accordingly those particles such as atoms and molecules which have been produced as a result of completion of such reactions as etching or deposition would not stay long at the objective, but will be removed therefrom quickly through, for example, diffusion. Therefore, at the surface of the objective, the waste gaseous particles are removed quickly, and in their place freshly excited particles are supplied onto the surface. Thus, the possibility of contamination of the surface of the objective by the products of reaction becomes very small. In other words, the dry process according to the method of the present invention can be termed a very clean one.

As the type of the light supply, there may be used a light emission source having a wide emission spectra such as a mercury lamp, a xenon lamp or a halogen lamp. It should be noted here that the light supply requires to be such that it emits, among the light rays of the irradiating beam, those light rays having an energy necessary for accomplishing the required activation of particles contained in the gas. In case a light supply such as mercury lamp, xenon lamp or halogen lamp which produces light rays having a wide range of wavelengths, it is effective also to derive, out of these light rays through spectroscopy, a beam of light having a desired specific wavelength which is capable of causing an aimed reaction. The light supply may be such that it emits selectively a beam of light rays having, generally, necessary for being used in photochemistry, or having a wavelength possessing an energy necessary for the particles to absorb the light rays to elevate from their ground level up to the activated state. There is an instance wherein those particles which have been produced freshly due to photolysis become particles having an activated state. In case, for example, a beam of monochromatic light rays such as laser which meets the absorption spectrum of a specific type of particles is used, it is possible to selectively cause an activation or its accompanying reaction. Alternatively, by using a light supply consisting of a plurality of kinds of monochromatic lights which are arranged to irradiate simultaneously, it becomes possible also to excite the required more-than-one kinds of particles.

The adjustment of pressure of the gas contained in the higher pressure gas region is performed by using the evacuation system 6 and by using the gas introduction system 8. In such a case, the function or the degree of vacuum which is reached by the evacuation system 6 need not be very high. For example, the degree of vacuum may be enough if it is of such a degree as $10^{-2}$ Torr which can be obtained by a rotary pump. The pressure in the higher pressure gas region is enough if it results in making the mean free path of gaseous particles existing in the gas shorter than the dimensional order of construction of the apparatus such as the diameter of the ejection through-holes 11 formed through the partition wall shown in FIG. 1. Though depending on the type of the excited particles which are to be produced, said pressure may be the atmospheric pressure or could be a pressure greater than that. In case the operation is performed under a gas pressure above the atmospheric pressure, there may be an instance wherein there is no particular need for using such evacuating means as a pump to serve as the evacuator. It should be noted here that, as the means of perfoming an adjustment of the internal pressure of the chamber, or as the means of adjusting the evacuation rate, there may be employed a pump or a needle valve or the like.

Figure 2:
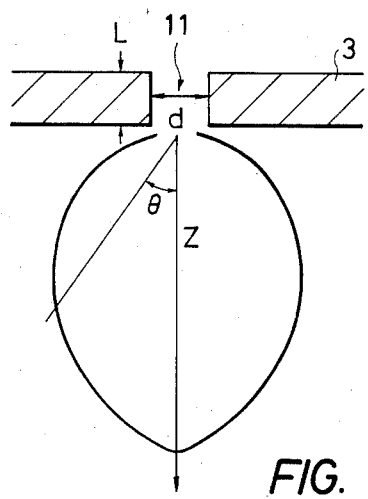
FIG. 2 is a diagrammatic representation for explaining the distribution of the directions of flow of activated particles as they are supplied onto the lower pressure gas region through an ejection through-hole due to the difference in pressure of gas in these two regions.

The distribution of directions of the flow of those particles into the lower pressure gas region depends greatly upon the shape of the ejection through-holes 11 used. Description will hereunder be made of the instance wherein the ejection through-holes have a circular shape as an example. FIG. 2 shows a sectional view in case the ejection through-hole is of a circular shape, and also shows the distribution of flow of those particles having ejected into the lower gas pressure region. The distribution of the particles is determined by the values of the thickness L of the partition wall and the diameter d of the through-hole, the pressure of the gas, and the type of the gaseous particles. Generally, the larger the difference in pressure of gas is, and the larger the value of L/d is, the more will converge the directional distribution of particles toward the target, i.e. in the direction Z. Thus, the distribution of the direction of flow of particles will have to be determined by designing those conditions mentioned above.

In case of processing, for example, a substrate (objective) having a large surface area, it will be noted that, if the ejection through-hole for particles is just one in number, there will develop a lateral distribution gradient in the flow of particles within the surface area of the substrate (objective) in accordance with the degree of the reaction conducted.

In such a case, it is only necessary to provide a plurality of ejection through-holes to thereby uniformalize the lateral distribution of the ejected particles which are supplied onto the surface area of the substrate. Also, the shape of the ejection through-holes is not limited to just a circular shape, but it may be of square, rectangular, slit-like or any other shape, provided that the through-holes can cause oriented jet streams of particles into the lower pressure gas region.

Figure 3:
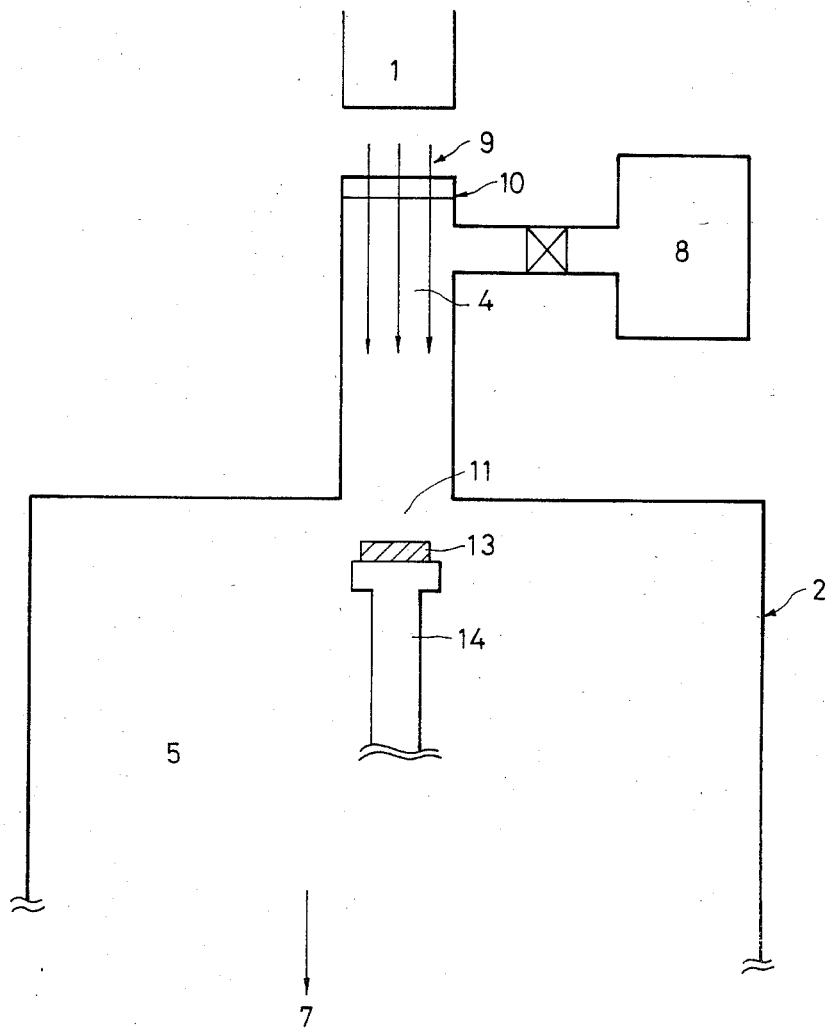
FIG. 3 is a diagrammatic representation of an embodiment of the apparatus intended to accomplish the present invention but having a construction modified from that of FIG. 1.

The embodiment of the apparatus shown in FIG. 1 is arranged so that the higher pressure gas region is separated from the lower gas pressure region by a partition wall, and that evacuation is effected in each region independently from each other. In order to set these two regions whose gas pressures are different from each other, a modified designing may be made so as to provide a chamber having two adjacent regions having different cross setional areas relative to each other in a direction substantially normal to the direction of the gas flow. FIG. 3 shows a modified embodiment of the apparatus for the explanation of such a design as stated just above. A region having a smaller cross sectional area is connected, for communication, with a region having a large cross sectional area. By evacuating the region having the larger cross sectional area, the gas pressure in the region having the smaller cross sectional area will be made higher than the region having the larger cross sectional area. This latter embodiment of the apparatus is intended to utilize the flow of gas from the higher pressure gas region 4 in the region having a smaller cross sectional area in the direction substantially normal to the direction of tha gas flow into the lower gas pressure region 5 provided in the region having the larger cross sectional area. A beam of light rays 9 is caused to travel in parallel with the stream of gas flowing through the higher pressure gas region 4. The difference in the gas pressures is determined by such factors as the ratio of the diameters of the higher pressure gas region 4 and the lower pressure gas region 5 in the direction normal to the direction of the gas flow, the evacuation rate of the pump, the pressure of the introduced gas, and the like. Also, the number of those particles supplied onto the surface of the objective would vary depending on the distance between the ejection through-hole 11 and the objective 13. Since the distribution, in the direction of the flow of those particles supplied onto the objective, also is determined by the positional relationship between the objective and the ejection through-hole 11, there is the necessity that, in order to obtain a uniform reaction, optimum values be set which can be determined by the conditions such as the dimension of the apparatus and the volume of the gas which is introduced into the apparatus.

Apart from the technique of forming a gas flow just mentioned above, arrangement may be made so that the passageway of gas connecting the higher pressure gas region 4 to the lower pressure gas region 5 is designed relatively narrow and oblong to produce a drop of pressure within this passageway. In such an instance, an objective may be placed in the lower gas pressure region 5. However, alternatively, the objective may be placed in the passageway, and this latter arrangement of the objective could result in an improved orientation of the reaction.

The evacuator of the lower pressure gas region 5 need be such one as is capable of producing a sufficiently high degree of vacuum. The mean free path of the gaseous particles is determined by the pressure of the gas to be used. However, it is desirable that the degree of vacuum in the lower pressure gas region be set at such a pressure as will insure the mean free path of the particles to be greater than the dimensional order of the system.

With respect to the excitation of gas-phase particles by irradiation of light rays, it should be noted that there are instances wherein it is effective to activate not only those particles existing in the gas, but also the surface of the objective per se. For example, such instances may be considered to occur when a beam of light rays irradiates the surface of a semiconductor, resulting in the acceleration of the progress of the chemical reactions taking place at the surface of this semiconductor. Or, in case films are to be laminated on the surface of a semiconductor, the quality of these films is improved by exposing the gas-phase particles to a beam of light rays. Thus, not only the excitation (activation) of the gas-phase particles alone by an irradiation of light rays onto the gas, but also by the combination of this irradiation onto the gas and the activation of the surface of the objective by irradiation, it becomes possible to make this dry process of the present invention all the more effective. In case this improved process is to be conducted by the use of the apparatus shown in FIG. 1, it can be realized, for example, by forming the partition wall 3 with a material which is transparent to the incident light rays. In such an instance, when the wavelength of the light rays for exciting the particles differs from that of the light rays intended for activating the surface of the objective, there may be used two light supplies, or alternatively there may be used a light supply which emits two kinds of monochromatic light rays.

As described above, the dry process of the present invention relying on photochemistry is arranged so that a beam of light rays is applied onto the higher pressure gas region to activate particles with a good efficiency, and that those excited particles thus produced are transported as being carried in a flow of gas caused by the difference in the pressure of gas, so as to be supplied onto the objective which is placed in the lower pressure gas region. Thus, this method of the present invention insures that a clean process is carried out without being accompanied by the development of damages to the objective. Furthermore, the dry process of the present invention has a large industrial value in that it has many advantages such that the excited particles can be oriented so that oriented reactions can be carried out, with the result that damageless, anisotropic dry etching can be materialized.

What is claimed is:

1. A dry process for fabricating a semiconductor device by utilizing photochemical reactions using a reactant gas fed into a vessel housing therein a semiconductor substrate to perform etching of or deposition onto said substrate, comprising:

establishing, in said vessel, a higher pressure gas first region and an adjacent lower pressure gas second region communicating with said first region by at least one gas passageway formed therebetween to produce a difference in pressure of the gas between the first and second gas regions, causing a flow of said gas from said first region into said second region through said gas passageway;

placing said substrate in a region in said vessel wherein there exsists a low pressure of said gas;

irradiating at least one beam of light rays onto the gas supplied into said first region to activate particles contained in said gas; and transporting the resulting activated gas-phase particles from the first region into the second region as they are carried in said flow of gas to be distributed onto said substrate placed in said second region, whereby performing said etching of or deposition onto the substrate.

2. A dry process according to claim 1, wherein: the irradiation of the beam of light rays onto the gas in said first region is performed through a window provided on the first region to selectively allow the transmission therethrough of only a beam of light rays having a required wavelength from among the light rays emitting from an external light supply, to impinge onto the gas contained in said first region to activate a selected kind of particles contained in the gas in the first region.

3. A dry process according to claim 1, wherein: the irradiation of the beam of light rays onto the gas in said first region is performed through a window provided on the first region to allow the transmission therethrough of a beam of light rays emitting from an external light supply designed to emit light rays having only a required wavelength, to impinge onto the gas contained in the gas in the first region to activate a selected kind of particles contained in the gas in the first region.

4. A dry process according to claim 1, wherein: the irradiation of the beam of light rays onto the gas in said first region is performed through a window provided on the first region to allow the transmission therethrough of a pulurality of beams of light rays having required different wavelengths emitting from a plurality of external light supplies, to activate a plurality of kinds of particles contained in the gas in the first region.

5. A dry process according to claim 2 wherein: the beam or beams of light rays has or have a wavelength or wavelengths ranging from vacuum ultraviolet to infrared regions of spectrum.

6. A dry process according to claim 1, wherein: said gas passageway has such a cross sectional configuration as will cause an oriented flow of particles into the second region.

7. A dry process according to claim 1, wherein: said higher pressure of gas in said first region is established by a gas evacuating means and a gas supply means both being adjustably connected to said first region to insure that a mean free path of the particles in the gas therein is shorter than a dimensional order of the gas passageway, and said lower pressure of gas in said second region is produced by an adjustable gas evacuating means connected to this second region and by said gas passageway.

8. A dry process according to claim 1, wherein: said higher pressure gas first region has a smaller effective cross sectional area as viewed in a direction substantially normal to the direction of the flow of gas through said gas passageway, as compared with an effective similar cross sectional area of said lower pressure gas second region, these two regions being communicated with each other by a single said gas passageway formed by said first region which opens into the second region.

9. A dry process according to claim 8, wherein: said substrate is placed in the lower pressure gas second region.

10. A dry process according to claim 8, wherein: said substrate is placed in a lower pressure gas region in said gas passageway.

11. An apparatus for performing a dry process utilizing photochemical reactions to perform etching of or deposition onto a semiconductor substrate housed in a vessel supplied with a reactant gas, to fabricate a semiconductor device, comprising:
a vessel;
a first region formed in said vessel wherein the reactant gas supplied is kept at a certain level of pressure;
a second region formed adjacent to said first region in said vessel to be supplied with the gas from said first region through at least one passageway communicating with said first and said second region and to keep this supplied gas at a pressure sufficiently lower than said level of gas in said first region to cause a difference in the pressure of gas between these two regions to thereby produce a flow of gas from the first region into the second region through said gas passageway; and
light beam generating means provided externally of the vessel to emit at least one beam of light rays to impinge onto the gas fed into said first region to activate gas-phase particles contained in said gas,
whereby allowing the resulting activated gas-phase particles to be carried in said flow of gas to be distributed into said second region onto the substrate placed at a site in the vessel wherein the pressure of the gas is lower that than in the first region to perform said etching of or deposition onto said substrate.

12. An apparatus according to claim 11, wherein: said substrate is placed in said second region.

13. An apparatus according to claim 11, wherein: said first region is provided with a gas pressure adjusting means comprising:
an adjustable gas supply means connected thereto to supply a reactant gas thereinto at a desired rate; and
an adjustable gas-evacuating means connected thereto to evacuate the reactant has therefrom at a desired rate, and
said second region is provided with an adjustable gas-evacuating means connected thereto to evacuate, at a desired rate, the activated particle-containing gas supplied from said first region.

14. An apparatus according to claim 11, wherein: said first region is provided with a window for selectively transmitting therethrough only a beam of light rays having a required wavelength from among the light rays emitting from the external light beam generating means, to impinge onto the gas contained in said first region to activate a selected kind of particles contained in the gas in the first region.

15. An apparatus according to claim 11, wherein: said first region is provided with a window for transmitting therethrough a beam of light rays emitting from the external light beam generating means designed to emit light rays having only a required wavelength, to impinge onto the gas contained in said first region, to activate a selected kind of particles contained in the gas in the first region.

16. An apparatus according to claim 11, wherein: said first region is provided with a window for transmitting therethrough a plurality of beams of light rays having required different wavelengths emitting from the external light beam generating means capable of emitting a plurality of kinds of light ray beams to activate a plurality of kinds of particles contained in the gas in the first region.

17. An apparatus according to claim 14, wherein: the beam or beams of light rays has or have a wavelength or wavelengths ranging from ultraviolet to infrared regions of spectrum.

18. An apparatus according to claim 11, wherein: said gas passageway has such a cross sectional configuration as will cause an oriented flow of particles into the second region.

19. An apparatus according to claim 11, wherein: said first region and said second region are divided from each other in said vessel by a partition wall having said at least one gas passageway formed therethrough for allowing said flow of gas containing the activated gas-phase particles from said first region into said second region.

20. An apparatus according to claim 11, wherein: said higher pressure gas first region has a smaller effective cross sectional area as viewed in a direction substantially normal to the direction of the flow of gas through said gas passageway, as compared with an effective similar cross sectional area of said lower pressure gas second region, these two regions being communicated with each other by a single said gas passageway formed by said first region which opens into the second region.

21. An apparatus according to claim 20, wherein: said substrate is placed in a lower pressure gas region in said single gas passageway.

* * * * *